(12) United States Patent
Hikosaka

(10) Patent No.: US 11,086,086 B2
(45) Date of Patent: Aug. 10, 2021

(54) OPTICAL CONNECTOR DEVICE

(71) Applicant: YAZAKI CORPORATION, Tokyo (JP)

(72) Inventor: Tomohiro Hikosaka, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/816,543

(22) Filed: Mar. 12, 2020

(65) Prior Publication Data

US 2020/0209488 A1 Jul. 2, 2020

Related U.S. Application Data

(63) Continuation of application No. PCT/JP2018/028694, filed on Jul. 31, 2018.

(30) Foreign Application Priority Data

Sep. 21, 2017 (JP) ............................. JP2017-181297

(51) Int. Cl.
*G02B 6/42* (2006.01)
*G02B 6/38* (2006.01)
*G02B 6/36* (2006.01)

(52) U.S. Cl.
CPC .............. *G02B 6/389* (2013.01); *G02B 6/36* (2013.01); *G02B 6/3873* (2013.01); *G02B 6/42* (2013.01); *G02B 6/423* (2013.01); *G02B 6/426* (2013.01); *G02B 6/4292* (2013.01); *G02B 6/3895* (2013.01); *G02B 6/4204* (2013.01)

(58) Field of Classification Search
None
See application file for complete search history.

(56) References Cited

U.S. PATENT DOCUMENTS

| | | | |
|---|---|---|---|
| 6,341,898 B1* | 1/2002 | Matsushita | G02B 6/4292 385/139 |
| 2003/0034438 A1* | 2/2003 | Sherrer | G02B 6/4257 250/216 |
| 2014/0348472 A1 | 11/2014 | Kondo et al. | |
| 2015/0016785 A1 | 1/2015 | Kondo et al. | |
| 2015/0346434 A1* | 12/2015 | Kubota | G02B 6/3885 385/79 |
| 2017/0070012 A1 | 3/2017 | Hiramatsu et al. | |

FOREIGN PATENT DOCUMENTS

| | | |
|---|---|---|
| JP | 2008-166048 A | 7/2008 |
| JP | 2012-190707 A | 10/2012 |
| JP | 2013-210418 A | 10/2013 |
| JP | 2015-75740 A | 4/2015 |
| JP | 2015-220169 A | 12/2015 |

* cited by examiner

*Primary Examiner* — Michelle R Connelly
(74) *Attorney, Agent, or Firm* — Sughrue Mion, PLLC

(57) ABSTRACT

An optical connector device includes: a first optical connector that has a first housing; and a second optical connector that has a second housing that has formed therein a fitting space into which the first housing can be fitted. Fitting regulation convex portions are provided to an upper inner wall surface and a lower inner wall surface of the fitting space. Fitting regulation concave portions are provided in an upper surface and a lower surface of the first housing. First fitting regulation portions are formed at distal end of the fitting regulation convex portions. Fitting sliding surfaces are formed at the fitting regulation concave portions.

2 Claims, 6 Drawing Sheets

OPTICAL CONNECTOR DEVICE

CROSS REFERENCE TO RELATED APPLICATIONS

This application is a continuation of International Patent Application No. PCT/JP2018/028694 filed on Jul. 31, 2018, claiming priority to Japanese Patent Application No. 2017-181297 filed on Sep. 21, 2017, the contents of which are incorporated herein by reference.

FIELD OF INVENTION

The present invention relates to an optical connector device used in an optical communication field, and more specifically, to an optical connector device in which a light guide member is arranged between a fiber optic transceiver (FOT) and a mating side thereof.

BACKGROUND ART

Conventionally, for example, an optical connector device is used for optical communication between in-vehicle devices. As the optical connector device, a technique disclosed in JP2012-190707A has been used.

An optical connector device 1 shown in FIGS. 1 and 6 of JP2012-190707A includes a first optical connector 100 provided at a terminal of an optical fiber 88 and a second optical connector 200 that is mated with the first optical connector 100.

The first optical connector 100 includes an inner housing 50 provided with a lock arm 55 on an upper wall surface thereof, an outer housing 60 slidably mounted in a connector fitting direction with respect to the inner housing 50, and a ferrule 80 accommodated and held in an inner portion of the inner housing 50 in a state in which a distal end of the optical fiber 88 is held.

The second optical connector 200 includes a connector housing 210, a FOT 220 accommodated and fixed into an inner portion of the connector housing 210, and a metal shell 260 provided so as to cover an outer portion of the connector housing 210. The connector housing 210 includes a hood portion 212 in which the inner housing 50 of the first optical connector 100 can be fitted. An engagement convex portion 215 projects at a position close to an opening edge of the upper inner wall among inner walls of the hood portion 212.

For fitting of the first optical connector 100 and the second optical connector 200, first, the inner housing 50 of the first optical connector 100 is inserted into the hood portion 212 of the second optical connector 200. Then, a lock portion 55a of the lock arm 55 hits against the engagement convex portion 215, and the lock portion 55a slides on the engagement convex portion 215, so that the lock arm 55 deflects toward the inside of the second optical connector 200. Thereafter, when a distal end surface of the inner housing 50 reaches the innermost portion of the hood portion 212, as shown in FIG. 9, the lock arm 55 returns from the deflection, and the lock portion 55a of the lock arm 55 engages with a back surface of the engagement convex portion 215 of the second optical connector 200. As a result, the first optical connector 100 and the second optical connector 200 fit to each other.

In the related art, when the first optical connector 100 and the second optical connector 200 fit to each other, the inner wall of the hood portion 212 of the second optical connector 200 guides the insertion of the inner housing 50 of the first optical connector 100.

Here, when the inner housing 50 is inserted into the hood portion 212, the lock arm 55 of the inner housing 50 deflects toward the inside of the second optical connector 200, so that a downward load is applied to the inner housing 50. When the load is applied to the inner housing 50 in this manner, an area (hereinafter referred to as a sliding area) of a lower wall surface of the inner housing 50 sliding on the inner wall of the hood portion 212 increases. Such increase of the sliding area may increase a friction generated between the inner housing 50 and the inner wall of the hood portion 212 when the inner housing 50 is inserted into the hood portion 212. Such increase of the friction may increase an insertion force of the inner housing 50 when the inner housing 50 is inserted into the hood portion 212. Therefore, there is a problem that a loss of the insertion force may increase.

In the related art, since it is necessary to suppress play of the inner housing 50 inside the hood portion 212, high dimensional accuracy is required in forming the hood portion 212. However, since the inner wall of the hood portion 212 has a large area, it is assumed that it is difficult to manage the dimensional accuracy. Therefore, inside the hood portion 212, the play of the inner housing 50 may occur, and optical axes of a plug-side optical fiber and a lens on a second optical connector 200 side may deviate. Such deviation between the optical axes may increase an optical loss in a connector fitting state.

Further, in the related art, improving the dimensional accuracy necessitates high precision of a molding die. This may increase manufacturing cost of the optical connector device.

SUMMARY

Illustrative aspects of the present invention provide an optical connector device that reduces a loss of an insertion force at the time of connector insertion and reduces an optical loss in the connector fitting state.

(1) An optical connector device includes: a first optical connector including a first housing, the first housing being configured to hold a ferrule provided at a distal end of an optical fiber; and a second optical connector including a second housing, the second housing being configured to accommodate a fiber optic transceiver and a light guide member for the fiber optic transceiver and including a fitting space into which the first housing is fitted. Fitting regulation convex portions extending along a fitting direction of the first optical connector with respect to the second optical connector are provided on one of: an upper surface and a lower surface of the first housing; or an upper inner wall surface and a lower inner wall surface defining the fitting space of the second housing. Fitting regulation concave portions extending the fitting direction and to which the fitting regulation convex portions are fitted are provided on another one of: the upper surface and the lower surface of the first housing; or the upper inner wall surface and the lower inner wall surface of the second housing. Each of the fitting regulation convex portions includes a first fitting regulation portion at a distal end portion of the fitting regulation convex portion. Each of the fitting regulation concave portions includes a fitting sliding surface, on which the first fitting regulation portion is slidable, at a deepmost part of the fitting regulation concave portion. Each of the fitting regulation convex portions is configured such that the first fitting regulation portion is guided by a corresponding one of fitting regulation concave portions with the first fitting regulation portion sliding on the fitting sliding surface when the first optical connector and the second optical connector are being fitted to each other, and such that the first fitting regulation portion is in contact with the fitting sliding surface in a state in which the first optical connector and the second optical connector are completely fitted to each other. The fitting regulation convex portions include at least one first fitting regulation convex portion and at least one second fitting regulation convex portion. The first fitting regulation convex portion includes a pair of side surfaces configured as second fitting regulation portions, the second fitting regulation portions are configured to be in contact with a pair of side wall surfaces of a corresponding one of fitting regulation concave portions in the state in which the first optical connector and the second optical connector are completely fitted to each other. The second fitting regulation convex portion include a pair of side surfaces configured to be spaced apart from a pair of side wall surfaces of a corresponding one of fitting regulation concave portions in the state in which the fitting of the first optical connector and the second optical connector is completed.

(2) The at least one second fitting regulation convex portion includes a plurality of second fitting regulation convex portion. The fitting regulation convex portions provided on the upper surface and the lower surface of the first housing include two second fitting regulation convex portions provided on one of the upper surface and the lower surface and one first fitting regulation convex portion provided on another one of the upper surface and the lower surface, or the fitting regulation convex portions provided on the upper inner wall surface and the lower inner wall surface of the second housing include two second fitting regulation convex portions provided on one of the upper inner wall surface and the lower inner wall surface and one first fitting regulation convex portion provided on another one of the upper inner wall surface and the lower inner wall surface. The fitting regulation concave portions provided on the upper inner wall surface and the lower inner wall surface of the second housing include two fitting regulation concave portions provided on one of the upper inner wall surface and the lower inner wall surface and one fitting regulation concave portion provided on another one of the upper inner wall surface and the lower inner wall surface, or the fitting regulation concave portions provided on the upper surface and the lower surface of the first housing include two fitting regulation concave portions provided on one of the upper surface and the lower surface and one fitting regulation concave portion provided on another one of the upper surface and the lower surface.

EMBODIMENTS OF INVENTION

Hereinafter, an optical connector device according to a first embodiment of the present invention will be described with reference to FIGS. 1 to 5, and an optical connector device according to a second embodiment of the present invention will be described with reference to FIG. 6.

First Embodiment

Figure 1:
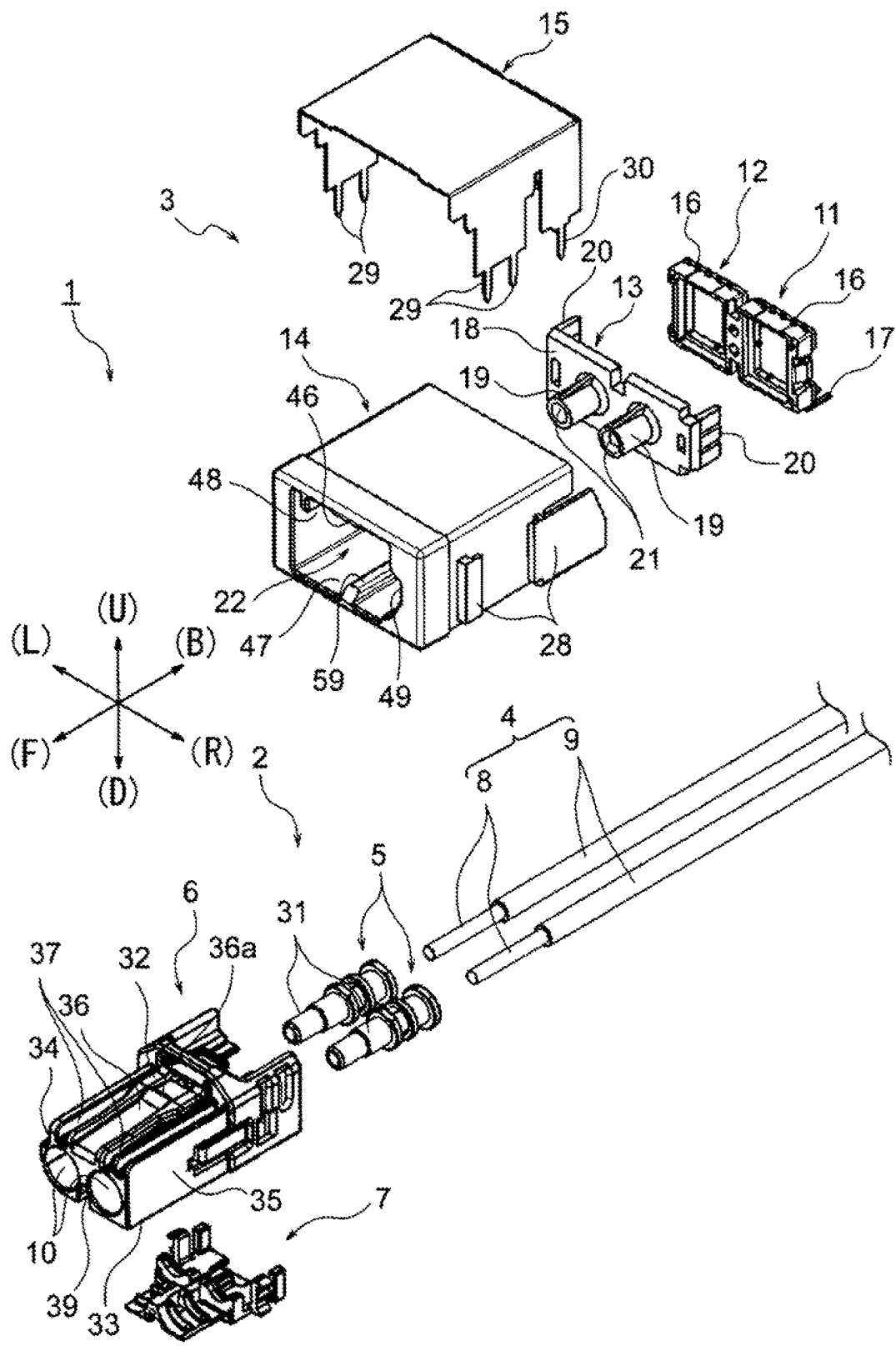
FIG. 1 is an exploded perspective view showing an optical connector device according to a first embodiment of the present invention.
Figure 2:
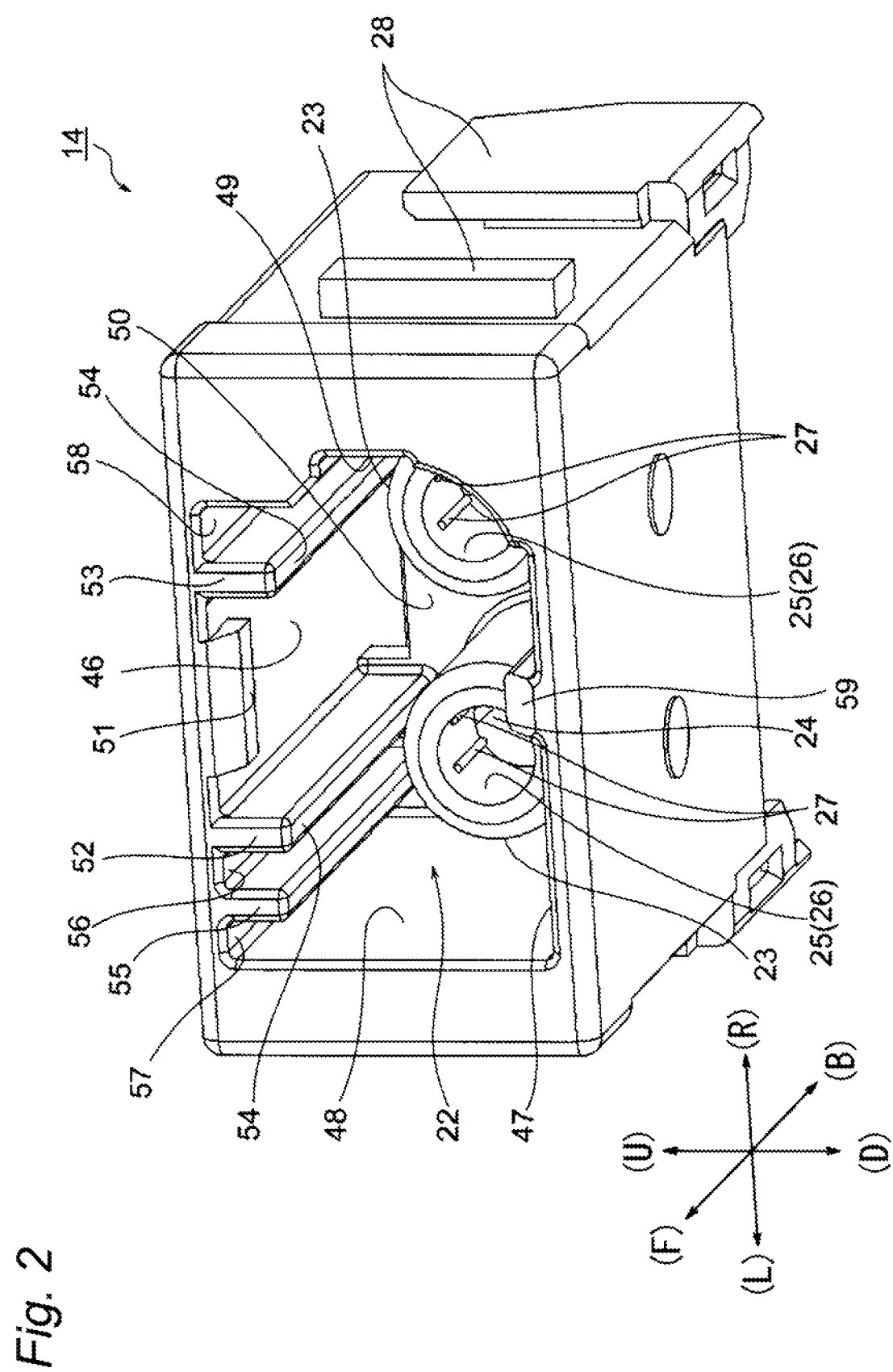
FIG. 2 is a perspective view of a second housing as viewed from below.
Figure 3:
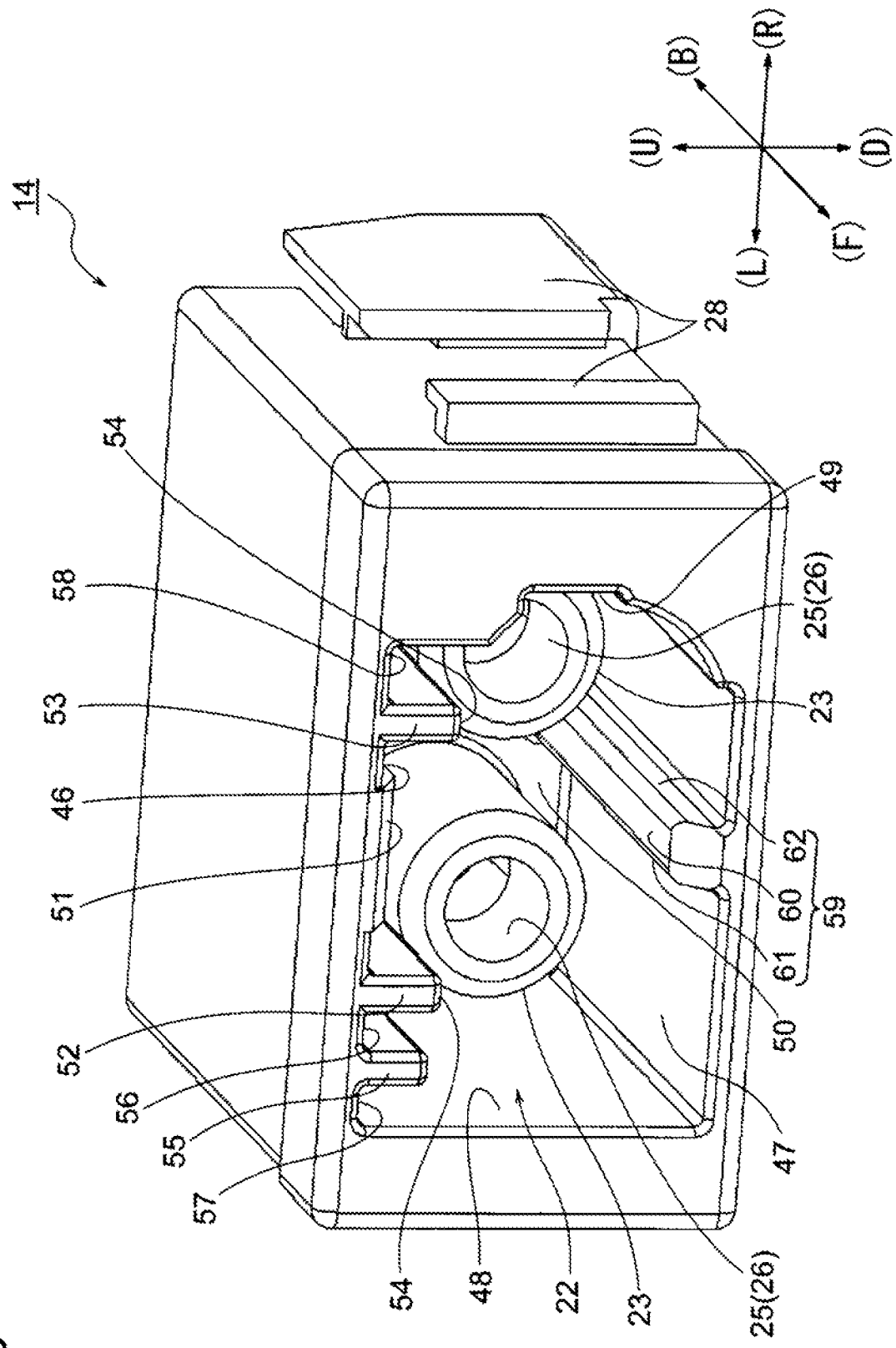
FIG. 3 is a perspective view of the second housing as viewed from above.
Figure 4:
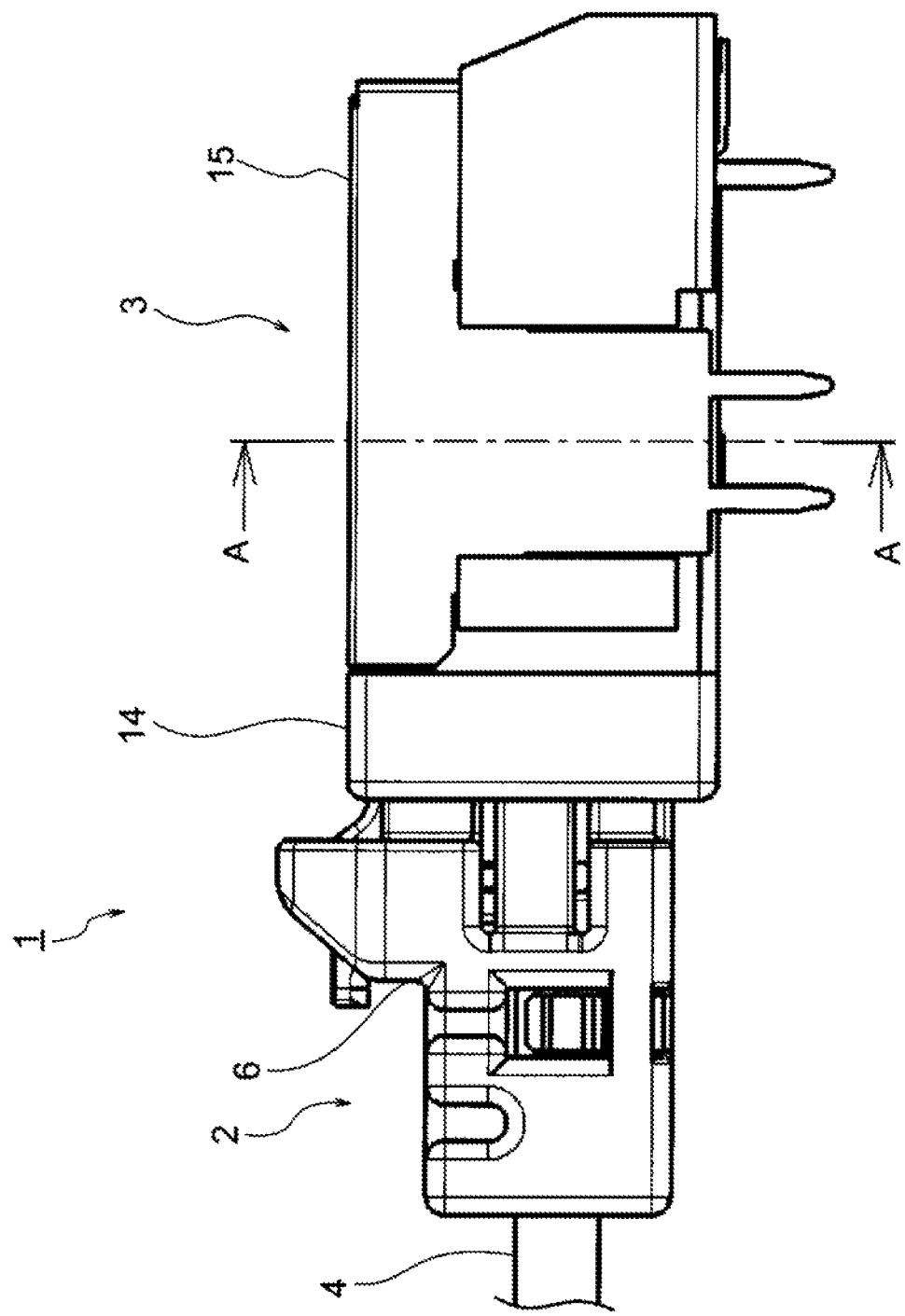
FIG. 4 is a side view showing the optical connector device in a state in which a first optical connector and a second optical connector are fitted to each other.
Figure 5:
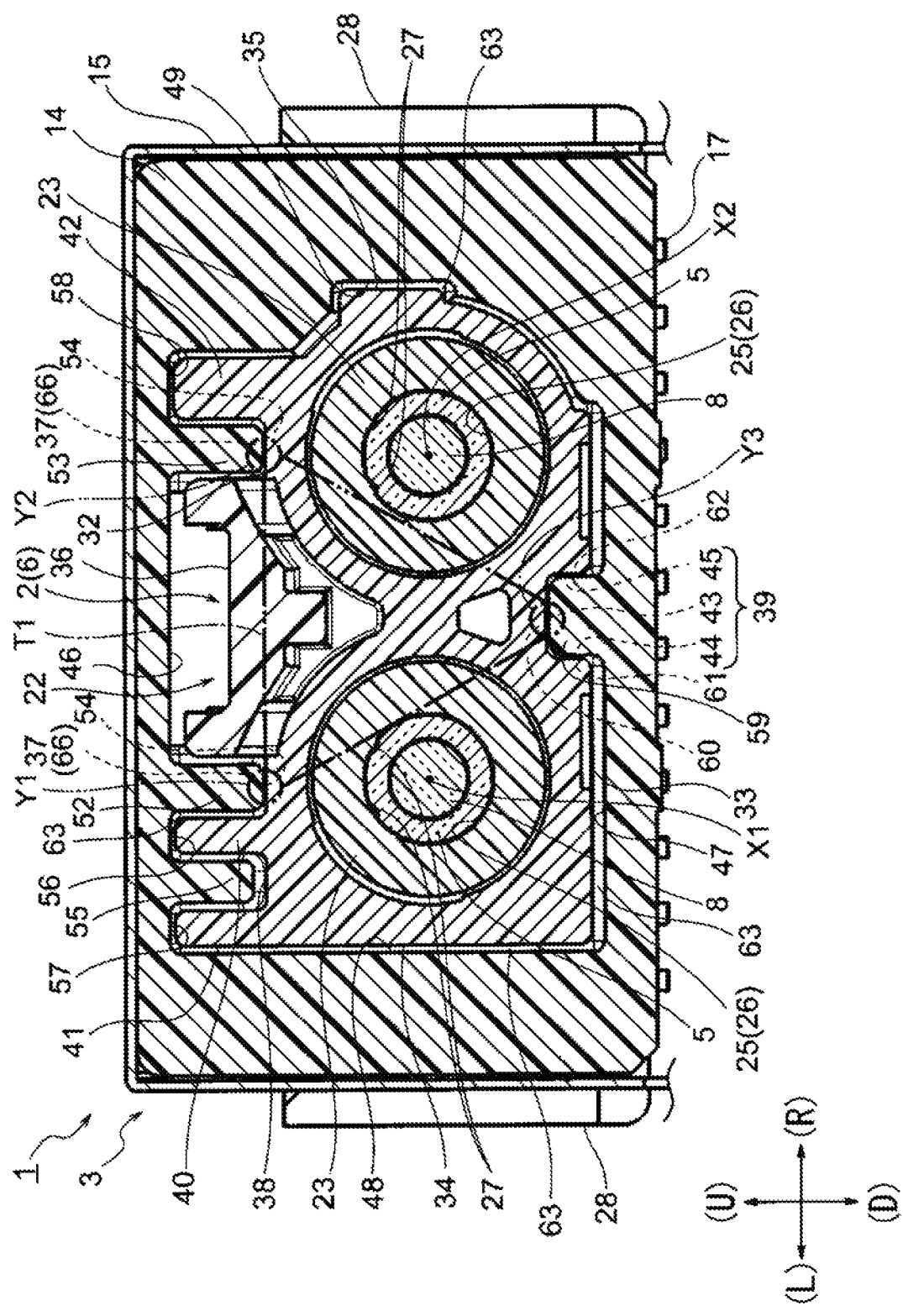
FIG. 5 is a sectional view taken along line A-A in FIG. 4.

FIG. 1 is an exploded perspective view showing an optical connector device according to a first embodiment of the present invention. FIG. 2 is a perspective view of a second housing as viewed from below, FIG. 3 is a perspective view of the second housing as viewed from above, FIG. 4 is a side view showing the optical connector device in a state in which a first optical connector and a second optical connector are fitted to each other, and FIG. 5 is a sectional view taken along line A-A in FIG. 4.

Note that, arrows (U) and (D) in the drawing indicate an upper-lower direction, arrows (L) and (R) in the drawing indicate a left-right direction, and arrows (F) and (B) indicate a front-rear direction (each of the directions of the arrows is an example).

In FIG. 1, an optical connector device 1 showing the first embodiment of the optical connector device according to the present invention is not particularly limited, but is used for optical communication between in-vehicle devices, for example.

The optical connector device 1 shown in FIG. 1 includes a first optical connector 2 and a second optical connector 3. As shown in FIG. 4, the optical connector device 1 is configured by fitting the first optical connector 2 and the second optical connector 3, and the first optical connector 2 and the second optical connector 3 are optically connected by the fitting. Hereinafter, each configuration of the optical connector device 1 will be described.

First, the first optical connector 2 will be described.

The first optical connector 2 shown in FIG. 1 is a so-called plug connector, and includes a pair of optical fiber cables 4, a pair of ferrules 5, a first housing 6, and a fixing member 7.

Hereinafter, each element of the first optical connector 2 will be described.

Each of the optical fiber cables 4 shown in FIG. 1 includes an optical fiber 8 made of light guide material and a coating portion 9. The optical fiber 8 is a so-called multimode plastic optical fiber including a core and a clad that have different refractive indexes from each other and are arranged coaxially with each other. The coating portion 9 includes a double sheath made of insulating synthetic resin coating an outer side of the optical fiber 8. The optical fiber 8 is exposed at a distal end of the optical cable 4 by peeling the coating portion 9.

Each of the ferrules 5 shown in FIG. 1 has a cylindrical shape, and is provided with a through hole through which the optical fiber 8 exposed at a distal end of the optical fiber cable 4 can be inserted and held.

The first housing 6 shown in FIG. 1 is made of insulating synthetic resin and is a member fittable to a second housing 14 to be described later. The first housing 6 includes therein ferrule accommodating portions 10 accommodating the ferrules 5 provided at the distal ends of the optical fiber cables 4, respectively. The first housing 6 includes a mounting portion, not shown, opened on a lower surface thereof on which the fixing member 7 is assembled.

The first housing 6 shown in FIG. 1 includes an engagement arm 36, fitting regulation concave portions 37, a guide concave portion 38, and guide convex portions 40 to 42 on an upper surface 32 (see FIG. 5). In addition, the first housing 6 shown in FIG. 1 includes a fitting regulation concave portion 39 on a lower surface 33.

As will be described later, when the first housing 6 is inserted into a fitting space 22 of the second housing 14, the engagement arm 36 shown in FIG. 1 is configured to deflect toward the inside of the second housing 14 by sliding on an engagement portion 51 (see FIGS. 2 and 3) of the second housing 14. An engagement protrusion 36a is formed on a distal end of the engagement arm 36. The engagement protrusion 36a is configured to engage with the engagement portion 51 of the second housing 14.

In the first embodiment, two fitting regulation concave portions 37 shown in FIG. 1 are provided on the upper surface 32 of the first housing 6. The fitting regulation concave portions 37 are formed on both left and right sides of the engagement arm 36. The fitting regulation concave portions 37 extend along a fitting direction in which the first housing 6 is fitted into the fitting space 22 of the second housing 14, and are configured such that fitting regulation convex portions 52, 53 to be described later of the second housing 14 can be fitted therein as shown in FIG. 5. Each of the fitting regulation concave portions 37 is provided with a fitting sliding surface 66 at the deepmost portion of the corresponding fitting regulation concave portion 37. The fitting sliding surface 66 is configured as a portion on which a first fitting regulation portion 54 (see FIGS. 2 and 3) to be described later slides when the first optical connector 2 (the first housing 6) and the second optical connector 3 (the second housing 14) are fitted to each other. As shown in FIG. 5, the fitting sliding surface 66 is configured as a portion with which the corresponding first fitting regulation portion 54 contacts in a state in which the first optical connector 2 (the first housing 6) and the second optical connector 3 (the second housing 14) are fitted to each other.

A guide concave portion 38 shown in FIG. 5 extends along the fitting direction in which the first housing 6 is fitted into the fitting space 22 of the second housing 14, and is configured such that a guide convex portion 55 to be described later of the second housing 14 can enter therein.

Each of the guide convex portions 40 to 42 shown in FIG. 5 has a rib shape extending along the fitting direction in which the first housing 6 is fitted into the fitting space 22 of the second housing 14. As shown in FIG. 5, the guide convex portions 40 to 42 are configured such that guide concave portions 56 to 58 to be described later of the second housing 14 can enter therein, respectively.

In the first embodiment, one fitting regulation concave portion 39 shown in FIG. 1 is provided on the lower surface 33 of the first housing 6. The fitting regulation concave portion 39 extends along the fitting direction in which the first housing 6 is fitted into the fitting space 22 of the second housing 14, and is configured such that a fitting regulation convex portion 59 to be described later of the second housing 14 can be fitted therein as shown in FIG. 5.

The fitting regulation concave portions 39 shown in FIG. 5 includes a fitting sliding surface 43 and a pair of side wall surfaces 44, 45. The fitting sliding surface 43 shown in FIG. 5 is formed at the deepmost portion of the fitting regulation concave portion 39. The fitting sliding surface 43 is configured as a portion on which a first fitting regulation portion 60 (see FIG. 3) to be described later is to slide when the first optical connector 2 (the first housing 6) and the second optical connector 3 (the second housing 14) are fitted to each other. As shown in FIG. 5, the fitting sliding surface 43 is configured as a portion with which the first fitting regulation portion 60 is to contact in the state in which the first optical connector 2 (the first housing 6) and the second optical connector 3 (the second housing 14) are fitted to each other.

The side wall surface 44 shown in FIG. 5 is formed to be continuous with a left side portion of the fitting sliding surface 43, and the side wall surface 45 is formed to be continuous with a right side portion of the fitting sliding surface 43. The side wall surfaces 44, 45 shown in FIG. 5 are configured as portions with which second fitting regulation portions 61, 62 to be described later are to contact.

The fixing member 7 shown in FIG. 1, without going into details, is a member provided separately from the first housing 6, and is a fixing member that fixes the ferrule 5 provided at the distal end of the optical fiber cable 4 to the first housing 6 by being attached to the first housing 6 with changing an engagement state from a tentative engagement state to a proper engagement state with respect to the first housing 6.

Next, the second optical connector 3 will be described.

The second optical connector 3 shown in FIG. 1 is a so-called PCB connector attached to a printed circuit board (hereinafter referred to as PCB) such as various electronic devices mounted on an automobile or the like. The second optical connector 3 includes a light emitting side fiber optic transceiver (hereinafter referred to as FOT) 11, a light receiving side FOT 12, a light guide member 13, the second housing 14, and a shield case 15. Hereinafter, each element of the second optical connector 3 will be described.

The light emitting side FOT 11 and the light receiving side FOT 12 shown in FIG. 1 are integrally formed and each include a FOT main body 16 and a plurality of lead frames 17 extending from the FOT main body 16. A light emitting element (for example, an LED), not shown, is built in the FOT main body 16 of the light emitting side FOT 11. A light receiving element (for example, PD), not shown, is built in the FOT main body 16 of the light receiving side FOT 12. The lead frame 17 is soldered to a circuit connection portion on a PCB, not shown, and is electrically connected to a predetermined circuit.

The light guide member 13 shown in FIG. 1 is made of transparent synthetic resin material having optical transparency, and includes a plate-like portion 18, tubular portions 19, and engagement portions 20. The plate-like portion 18 has a substantially rectangular plate shape, and the pair of tubular portions 19 are projected from the substantially center of the front surface of the plate-like portion 18. Each of the pair of tubular portions 19 includes lens unit 21 having a convex lens function therein. One lens unit 21 condenses light from the light emitting element of the light emitting side FOT 11 on an optical fiber 8, and the other lens unit 21 condenses light from the optical fiber 8 on the light receiving element of the light receiving side FOT 12. The engagement portions 20 are formed to be continuous with both sides of the plate-like portion 18, and are configured to engage with the light emitting side FOT 11 and the light receiving side FOT 12.

The second housing 14 shown in FIG. 1 is made of insulating synthetic resin, and has a box shape. The second housing 14 shown in FIGS. 2 and 3 includes the fitting space 22, a FOT accommodating portion, not shown, and a partition wall 50.

The fitting space 22 shown in FIGS. 2 and 3 is disposed on a front side of the inside of the second housing 14 and is configured as a space into which the first optical connector 2 (the first housing 6) shown in FIG. 1 can fit. The fitting space 22 includes an upper inner wall surface 46, a lower inner wall surface 47, a left inner wall surface 48, a right inner wall surface 49, and the partition wall 50 to be described later.

As shown in FIGS. 2 and 3, the fitting space 22 includes the fitting regulation convex portions 52, 53, the guide convex portion 55, and the guide concave portions 56 to 58 on the upper inner wall surface 46. In addition, the fitting space 22 includes the fitting regulation convex portion 59 on the lower inner wall surface 47.

In the first embodiment, two fitting regulation convex portions 52, 53 shown in FIGS. 2 and 3 are provided on the upper inner wall surface 46. Each of the fitting regulation convex portions 52, 53 shown in FIG. 2 has a rib shape extending along the fitting direction, in which the first housing 6 is fitted into the fitting space 22 of the second housing 14, from a front end of the upper inner wall surface 46 to a rear end of the upper inner wall surface 46. As shown in FIG. 5, the fitting regulation convex portions 52, 53 are configured to fit into the fitting regulation concave portions 37 of the first housing 6, respectively, when the first housing 6 is fitted into the fitting space 22 of the second housing 14.

The first fitting regulation portions 54 are formed at distal end portions of the fitting regulation convex portions 52, 53 shown in FIGS. 2 and 3, respectively. The first fitting regulation portions 54 shown in FIGS. 2 and 3 are configured to slide on the fitting sliding surfaces 66 of the first housing 6 and be guided by the fitting regulation concave portions 37, respectively, when the first optical connector 2 (the first housing 6) and the second optical connector 3 (the second housing 14) are fitted to each other. As shown in FIG. 5, the first fitting regulation portions 54 are respectively configured to be in contact with the fitting sliding surfaces 66 in the state in which the first optical connector 2 (the first housing 6) and the second optical connector 3 (the second housing 14) are fitted to each other.

The guide convex portion 55 shown in FIG. 2 has a rib shape extending along the fitting direction, in which the first housing 6 is fitted into the fitting space 22 of the second housing 14, from the front end of the upper inner wall surface 46 to the rear end of the upper inner wall surface 46. As shown in FIG. 5, the guide convex portion 55 is configured to be able to enter the guide concave portion 38 of the first housing 6.

Each of the guide concave portions 56 to 58 shown in FIG. 2 extends along the fitting direction, in which the first housing 6 is fitted into the fitting space 22 of the second housing 14, from the front end of the upper inner wall surface 46 to the rear end of the upper inner wall surface 46. As shown in FIG. 5, the guide concave portions 56 to 58 are configured such that the guide convex portions 40 to 42 can enter therein, respectively.

In the first embodiment, as shown in FIG. 3, one fitting regulation convex portion 59 is provided on the lower inner wall surface 47. As shown in FIG. 3, the fitting regulation convex portion 59 has a rib shape extending along the fitting direction, in which the first housing 6 is fitted into the fitting space 22 of the second housing 14, from a front end of the lower inner wall surface 47 to a rear end of the lower inner wall surface 47. As shown in FIG. 5, the fitting regulation convex portion 59 is configured such that the fitting regulation concave portion 39 of the first housing 6 can be fitted therein when the first housing 6 is fitted into the fitting space 22 of the second housing 14.

The fitting regulation convex portion 59 shown in FIG. 3 includes the first fitting regulation portion 60 and the pair of second fitting regulation portions 61, 62. The first fitting regulation portion 60 is formed at a distal end portion of the fitting regulation convex portion 59. The first fitting regulation portion 60 shown in FIG. 3 is configured to slide on the fitting sliding surface 43 of the first housing 6 and be guided by the fitting regulation concave portion 39 when the first optical connector 2 (the first housing 6) and the second optical connector 3 (the second housing 14) are fitted to each other. As shown in FIG. 5, the first fitting regulation portion 60 is configured to be in contact with the fitting sliding surface 43 in the state in which the first optical connector 2 (the first housing 6) and the second optical connector 3 (the second housing 14) are fitted to each other.

As shown in FIG. 3, the second fitting regulation portions 61, 62 are formed on both left and right side surfaces of the fitting regulation convex portion 59. As shown in FIG. 3, the second fitting regulation portion 61 is formed to be continuous with a left side portion of the fitting regulation convex portion 59, and the second fitting regulation portion 62 is formed to be continuous with a right side portion of the fitting regulation convex portion 59. As shown in FIG. 5, the second fitting regulation portions 61, 62 are respectively configured to be in contact with the side wall surfaces 44, 45 in a state in which the first optical connector 2 (the first housing 6) and the second optical connector 3 (the second housing 14) are completely fitted to each other.

The FOT accommodating portion is disposed on a rear side of the inside of the second housing 14 and is configured as a space that can accommodate the light emitting side FOT 11 and the light receiving side FOT 12.

The partition wall 50 shown in FIGS. 2 and 3 is a partition wall dividing the inside of the second housing 14 into the fitting space 22 and the FOT accommodating portion. As shown in FIGS. 2 and 3, the partition wall 50 includes a pair of female insertion portions 23. Each of the ferrule insertion portions 23 has a tubular shape and is configured to make the fitting space 22 and the FOT accommodating portion communicate with each other. As shown in FIG. 2, each of the ferrule insertion portions 23 includes a tubular portion insertion hole 24 on a base end side of the inside of the ferrule insertion portion 23, and a ferrule insertion hole 25 on a distal end side of the inside of the ferrule insertion portion 23.

The tubular portion insertion hole 24 shown in FIG. 2 is formed along an insertion direction of the tubular portion 19 so that the tubular portion 19 of the light guide member 13 shown in FIG. 1 can be inserted therein. The tubular portion insertion hole 24 is configured to arrange the lens unit 21 opposite to the ferrule insertion hole 25 when the tubular portion 19 of the light guide member 13 is inserted.

The ferrule insertion hole 25 shown in FIGS. 2 and 3 is formed along an insertion direction of the ferrule 5 so that the ferrule 5 can be inserted therein. The ferrule insertion hole 25 is configured to arrange the ferrule 5 opposite to the lens unit 21 of the light guide member 13 in the state in which the first optical connector 2 (the first housing 6) and the second optical connector 3 (the second housing 14) are fitted to each other and the ferrule 5 is inserted into the ferrule insertion hole 25.

The ferrule insertion holes 25 are formed such that the ferrules 5 are arranged so that optical axes X1, X2 (see FIG. 5) of the optical fibers 8 are substantially coincident with optical axes of the lens units 21 of the light guide members 13 in the state in which the ferrules 5 are inserted, respectively.

The ferrule insertion holes 25 may be configured such that the optical axes X1, X2 of the optical fibers 8 and the optical axes of the lens units 21 slightly deviate with each other as long as the optical axes X1, X2 of the optical fibers 8 and the optical axes of the respective lens units 21 of the light guide members 13 are parallel to each other in the state in which the ferrules 5 are inserted.

An inner peripheral surface 26 of each of the ferrule insertion holes 25 shown in FIGS. 2 and 3 has a cylindrical shape. In the first embodiment, as shown in FIGS. 2 and 3, the ferrule insertion hole 25 is provided with a pair of ferrule fixing structures 27 on the inner peripheral surface 26 thereof. As shown in FIG. 5, the ferrule fixing structures 27 are configured to press an outer peripheral surface 31 (see FIG. 1) of the ferrule 5 so that the ferrule 5 is pressed onto the inner peripheral surface 26 of the ferrule insertion hole 25 to be fixed. In the first embodiment, each of the ferrule fixing structures 27 has a rib shape with a circular arc shape in cross section, and extends along the insertion direction of the ferrule 5.

The ferrule fixing structure 27 is not limited to the one having the rib shape as described above. In addition, the ferrule fixing structure 27 may be, for example, a protrusion having a circular arc shape in cross section.

The ferrule fixing structures 27 may be configured to press the inner peripheral surface 26 of the ferrule insertion hole 25 so that the ferrule 5 is pressed onto the inner peripheral surface 26 on a lower side of the ferrule insertion hole 25 to be fixed. For example, although not particularly shown, the pair of ferrule fixing structures 27 may be provided on the outer peripheral surface 31 of the ferrule 5. Although not particularly shown, the pair of ferrule fixing structures 27 may be provided on the inner peripheral surface 26 of the ferrule insertion hole 25 and the outer peripheral surface 31 of the ferrule 5.

The second housing 14 shown in FIG. 1 is provided with shield case positioning portions 28 on both left and right side surfaces thereof. The shield case positioning portions 28 are configured to position the shield case 15 mounted to the second housing 14 in the front-rear direction (directions of the arrows (F) and (B)) and in the upper-lower direction (directions of the arrows (U) and (D)).

The shield case 15 shown in FIG. 1 is made of conductive metal, is a part having a box shape, and has a size capable of covering the second housing 14 in a state in which the light emitting side FOT 11 and the light receiving side FOT 12 are accommodated. Pin-shaped fixing portions 29 and ground portions 30 are formed in a lower portion of the shield case 15. The fixing portion 29 is inserted into and fixed to a fixing hole of the PCB. The ground portion 30 is inserted into a through hole of the PCB and soldered to the ground.

Next, a procedure for assembling (fitting of the first optical connector 2 and the second optical connector 3) the optical connector device 1 according to the first embodiment will be described.

First, the first optical connector 2 and the second optical connector 3 are assembled in advance. Thereafter, the first optical connector 2 is inserted into the fitting space 22 of the second housing 14 of the second optical connector 3 from the front side. Accordingly, the fitting of the first optical connector 2 and the second optical connector 3 is started.

Here, an operation of the optical connector device 1 according to the first embodiment when the first optical connector 2 and the second optical connector 3 are fitted will be described.

When the first optical connector 2 is inserted into the fitting space 22 of the second housing 14, the first fitting regulation portion 54 of each of the fitting regulation convex portions 52, 53 is guided by the corresponding fitting regulation concave portion 37 while sliding on the fitting sliding surface 66 of the corresponding fitting regulation concave portion 37, and the first fitting regulation portion 60 of the fitting regulation convex portion 59 is guided by the fitting regulation concave portion 39 while sliding on the fitting sliding surface 43 of the fitting regulation concave portion 39.

According to the optical connector device 1 according to the first embodiment, the first optical connector 2 is inserted into the fitting space 22 of the second housing 14 in the above state, so that an area (a sliding area) of the upper surface 32, the lower surface 33, a left side surface 34, and a right side surface 35 of the first housing 6 sliding on the inner wall surfaces 46 to 49 of the second housing 14 becomes smaller than that in the related art. As described above, since the sliding area becomes smaller, a friction generated between the upper surface 32, the lower surface 33, the left side surface 34, and the right side surface 35 of the first housing 6 and the inner wall surfaces 46 to 49 of the second housing 14 when the first optical connector 2 is inserted into the fitting space 22 of the second housing 14 becomes smaller than that in the related art. As described above, since the friction becomes smaller, an insertion force of the first housing 6 when the first housing 6 is inserted into the fitting space 22 of the second housing 14 becomes smaller than that in the related art.

When the first optical connector 2 continues to be inserted into the fitting space 22 of the second housing 14, the engagement protrusion 36a of the engagement arm 36 of the first housing 6 engages with the engagement portion 51 of the second housing 14, and as shown in FIG. 4, the first optical connector 2 and the second optical connector 3 are fitted to each other.

As shown in FIG. 4, in the state in which the first optical connector 2 and the second optical connector 3 are fitted to each other, the two first fitting regulation portions 54 are in contact with the fitting sliding surfaces 66, and the first fitting regulation portion 60 is in contact with the fitting sliding surface 43 as shown in FIG. 5. As shown in FIG. 5, positions where the first fitting regulation portions 54 are in contact with the fitting sliding surfaces 66 are defined as Y1, Y2, and a position where the first fitting regulation portion 60 is in contact with the fitting sliding surface 43 is defined as Y3, gaps 63 are formed between the upper surface 32, the lower surface 33, the left side surface 34, the right side surface 35 of the first housing 6 and the inner wall surfaces 46 to 49 of the second housing 14 except for Y1 to Y3.

In the state in which the first optical connector 2 and the second optical connector 3 are fitted to each other, the ferrule 5 of the first optical connector 2 is inserted into the ferrule insertion portion 23 of the second housing 14. Accordingly, the first optical connector 2 and the second optical connector 3 are optically connected. Therefore, the assembly of the optical connector device 1 (the fitting of the first optical connector 2 and the second optical connector 3) is completed.

Next, an operation of the optical connector device 1 according to the first embodiment in the state in which the first optical connector 2 and the second optical connector 3 are fitted will be described.

According to the optical connector device 1 according to the first embodiment, in the state in which the first optical connector 2 and the second optical connector 3 are fitted to each other, as shown in FIG. 5, Y1 to Y3 are arranged to have a substantially equilateral triangle shape when Y1 to Y3 are connected by virtual lines T1. As shown in FIG. 5, since Y1, Y2 are arranged at the same height position, and Y3 is arranged at a substantially intermediate portion between Y1 and Y2, play of the first housing 6 in the upper-lower direction (the directions of the arrows (U) and (D)) is restricted inside the fitting space 22. Since the play of the first housing 6 is restricted in this manner, a center of the ferrule 5 held by the first housing 6 is fixed. As described above, since the center of the ferrule 5 is fixed, the deviation of each of the optical axes X1, X2 of the optical fibers 8 with respect to the optical axis of the corresponding lens unit 21 of the light guide member 13 is suppressed.

According to the optical connector device 1 according to the first embodiment, the second fitting regulation portions 61, 62 of the fitting regulation convex portion 59 are in contact with the side wall surfaces 44, 45 of the fitting regulation concave portion 39. Therefore, the play of the first housing 6 in the left-right direction (the directions of the arrows (L) and (R)) is restricted inside the fitting space 22. In addition to restricting the play of the first housing 6 in the upper-lower direction, the play of the first housing 6 in the left-right direction is restricted, so that the center of the ferrule 5 held by the first housing 6 is more reliably fixed. Therefore, the deviation of each of the optical axes X1, X2 of the optical fibers 8 with respect to the optical axis of the corresponding lens unit 21 of the light guide member 13 is further suppressed.

Next, effects of the optical connector device 1 according to the present embodiment will be described.

As described above with reference to FIGS. 1 to 5, according to the first embodiment, the insertion force of the first housing 6 when the first housing 6 is inserted into the fitting space 22 of the second housing 14 becomes smaller than that in the related art, the center of the ferrule 5 is fixed, and the deviation of each of the optical axes X1, X2 of the optical fibers 8 with respect to the optical axis of the light guide member 13 (the lens unit 21) is suppressed, so that a loss of the insertion force at the time of connector insertion decreases, and an optical loss in connector fitting state decreases.

According to the first embodiment, it is important to manage dimensions of the fitting regulation convex portions 52, 53 and 59 and the fitting regulation concave portions 37, 39. Therefore, a range of dimensions managed in the fitting of the first optical connector 2 and the second optical connector 3 as important dimensions (fitting critical dimensions) decreases as compared with the related art. In this way, decreasing the management range of the fitting critical dimensions widens a tolerance range of dimensions except for the fitting critical dimensions. As a result, manufacturing cost of the optical connector device 1 decreases because cost associated with production of a molding die decreases.

Second Embodiment

In addition to the first embodiment, the optical connector device according to the present invention may use the following second embodiment. Hereinafter, the second embodiment will be described with reference to FIG. 6.

Figure 6:
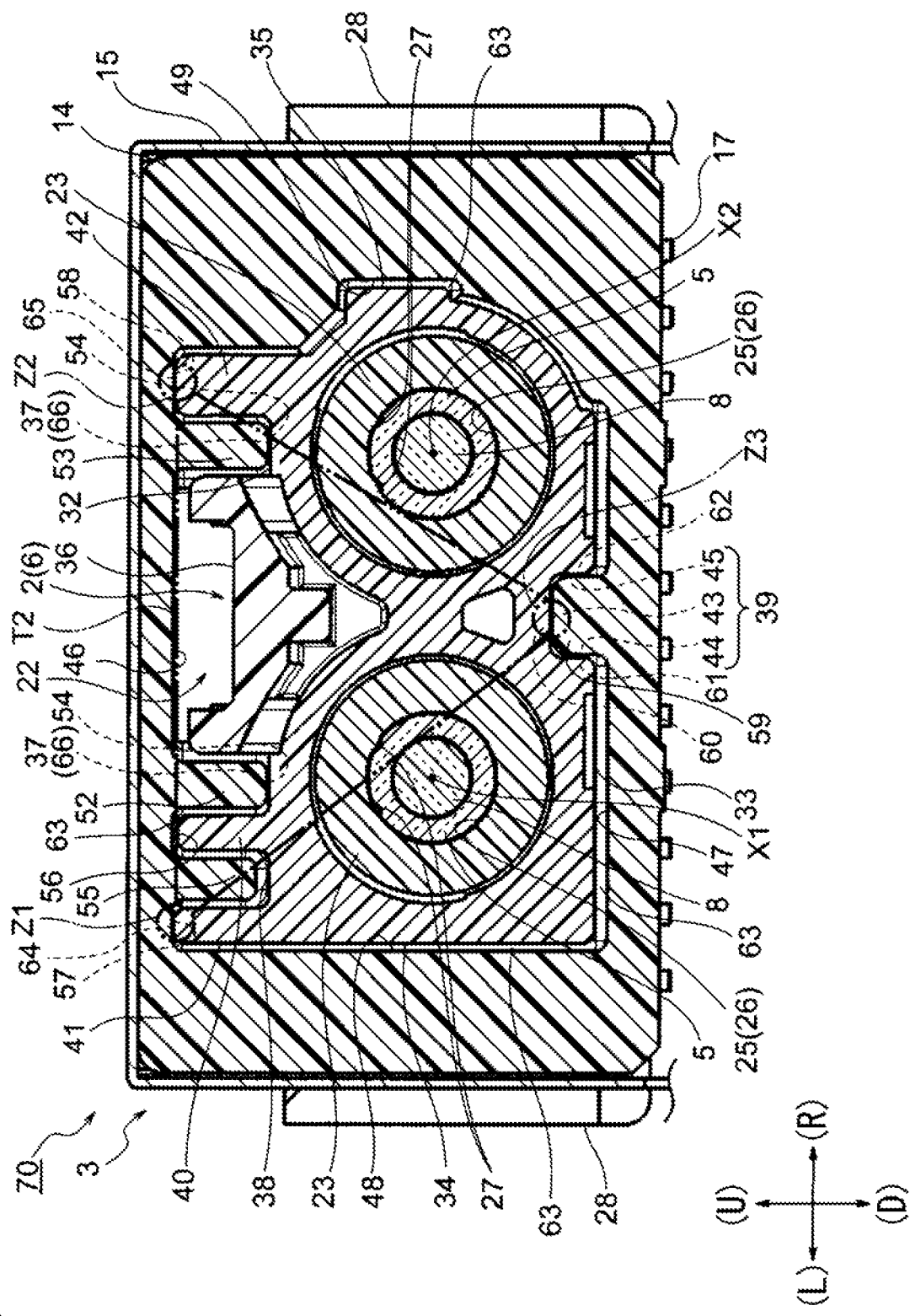
FIG. 6 is a sectional view showing an optical connector device according to a second embodiment of the present invention.

FIG. 6 is a sectional view showing an optical connector device according to the second embodiment of the present invention. The same components as those in the first embodiment are denoted by the same reference numerals, and a detailed description thereof is omitted.

An optical connector device 70 of the second embodiment shown in FIG. 6 is different from the first embodiment in that a distal end portion 64 of a guide convex portion 41 of the first housing 6 and a distal end portion 65 of a guide convex portion 42 of the first housing 6 are configured to be in contact with the upper inner wall surface 46 of the fitting space 22 in the state in which the first optical connector 2 and the second optical connector 3 are completely fitted to each other.

According to the optical connector device 70 according to the second embodiment, as shown in FIG. 6, when a position where the distal end portion 64 of the guide convex portion 41 is in contact with the upper inner wall surface 46 is defined as Z1, a position where the distal end portion 65 of the guide convex portion 42 is in contact with the upper inner wall surface 46 is defined as Z2, and a position where the first fitting regulation portion 60 is in contact with the fitting sliding surface 43 is defined as Z3, Z1 to Z3 are arranged to have a substantially equilateral triangle shape when Z1 to Z3 are connected by virtual lines T2. As shown in FIG. 6, since Z1, Z2 are arranged at the same height position, and Z3 is arranged between Z1 and Z2, the play of the first housing 6 in the upper-lower direction is restricted inside the fitting space 22, as in the first embodiment.

According to the optical connector device 70 according to the second embodiment, since the second fitting regulation portions 61, 62 of the fitting regulation convex portion 59 are in contact with the side wall surfaces 44, 45 of the fitting regulation concave portion 39, as in the first embodiment, the play of the first housing 6 in the left-right direction is restricted inside the fitting space 22.

Next, effects of the optical connector device 70 according to the second embodiment will be described.

As described above with reference to FIG. 6, the optical connector device 70 according to the second embodiment has the same effects as those of the first embodiment.

In addition, it goes without saying that the present invention can be variously modified without departing from the spirit of the present invention.

As described above, two fitting regulation concave portions 37 are provided on the upper surface 32 of the first housing 6 and one fitting regulation convex portion 39 is provided on the lower surface 33 of the first housing 6, and the fitting regulation convex portions 52, 53 are provided on the upper inner wall surface 46 of the second housing 14 and the fitting regulation convex portion 59 is provided on the lower inner wall surface 47 of the second housing 14, but the present invention is not limited thereto, and may be configured as follows.

That is, although not particularly shown, two fitting regulation convex portions may be provided on the upper surface 32 of the first housing 6 and one fitting regulation convex portion may be provided on the lower surface 33 of the first housing 6, and two fitting regulation concave portions may be provided on the upper inner wall surface 46 of the second housing 14 and one fitting regulation concave portion may be provided on the lower inner wall surface 47 of the second housing 14.

Although not particularly shown, one fitting regulation convex portion may be provided on the upper surface 32 of the first housing 6 and two fitting regulation convex portions may be provided on the lower surface 33 of the first housing 6, and one fitting regulation concave portion may be provided on the upper inner wall surface 46 of the second housing 14 and two fitting regulation concave portions may be provided on the lower inner wall surface 47 of the second housing 14.

The present invention is not limited to the embodiments described above and may be appropriately modified, improved, or the like. In addition, materials, shapes, dimensions, numbers, arrangement positions or the like of each constituent element in the embodiments described above are optional and not limited as long as the object of the invention can be achieved.

Here, characteristics of the embodiments of the optical connector device according to the present invention described above are briefly summarized and listed in the following [1] to [3], respectively.

[1] An optical connector device (1, 70) including:

a first optical connector (2) including a first housing (6), the first housing (6) being configured to hold a ferrule (5) provided at a distal end of an optical fiber (8); and a second optical connector (3) including a second housing (14), the second housing being configured to accommodate a FOT (light emitting side FOT 11 and light receiving side POT 12) and a light guide member (13) for the FOT and including a fitting space (22) into which the first housing is fitted, wherein fitting regulation convex portions (52, 53, 59) extending along a fitting direction of the first optical connector with respect to the second optical connector are provided on one of: an upper surface (32) and a lower surface (33) of the first housing; or an upper inner wall surface (46) and a lower inner wall surface (47) defining the fitting space of the second housing, wherein fitting regulation concave portions (37, 39) extending the fitting direction and to which the fitting regulation convex portions are fitted are provided on another one of: the upper surface and the lower surface of the first housing; or the upper inner wall surface and the lower inner wall surface of the second housing, wherein each of the fitting regulation convex portions includes a first fitting regulation portion (54, 60) at a distal end portion of the fitting regulation convex portion, wherein each of the fitting regulation concave portions includes a fitting sliding surface (43, 66), on which the first fitting regulation portion is slidable, at a deepmost part of the fitting regulation concave portion, and wherein each of the fitting regulation convex portions is configured such that the first fitting regulation portion is guided by a corresponding one of fitting regulation concave portions with the first fitting regulation portion sliding on the fitting sliding surface when the first optical connector and the second optical connector are being fitted to each other, and such that the first fitting regulation portion is in contact with the fitting sliding surface in a state in which the first optical connector and the second optical connector are completely fitted to each other.

[2] The optical connector device (1, 70) according to the above [1], wherein at least one fitting regulation convex portion (59) of the fitting regulation convex portions (52, 53, 59) includes a pair of side surfaces configured as second fitting regulation portions (61, 62), and the second fitting regulation portions are configured to be in contact with side wall surfaces (44, 45) of a corresponding one of fitting regulation concave portions (39) in the state in which the first optical connector and the second optical connector are completely fitted to each other.

[3] The optical connector device (1, 70) according to the above [1] or [2], wherein the fitting regulation convex portions (52, 53, 59) provided on the upper surface (32) and the lower surface (33) of the first housing (6) include two fitting regulation convex portions provided on one of the upper surface and the lower surface and one fitting regulation convex portion provided on another one of the upper surface and the lower surface, or the fitting regulation convex portions provided on the upper inner wall surface (46) and the lower inner wall surface (47) of the second housing (14) include two fitting regulation convex portions provided on one of the upper inner wall surface and the lower inner wall surface and one fitting regulation convex portion provided on another one of the upper inner wall surface and the lower inner wall surface, and wherein the fitting regulation concave portions (37, 39) provided on the upper inner wall surface and the lower inner wall surface of the second housing include two fitting regulation concave portions provided on one of the upper inner wall surface and the lower inner wall surface and one fitting regulation concave portion provided on another one of the upper inner wall surface and the lower inner wall surface, or the fitting regulation concave portions provided on the upper surface and the lower surface of the first housing include two fitting regulation concave portions provided on one of the upper surface and the lower surface and one fitting regulation concave portion provided on another one of the upper surface and the lower surface.

According to the optical connector device having the above configuration [1], the first fitting regulation portion of the fitting regulation convex portion is guided by the fitting regulation concave portion while sliding on the fitting sliding surface when the first optical connector and the second optical connector are fitted to each other. Therefore, an area (sliding area) of an outer surface of the first housing sliding on an inner wall surface of the second housing becomes smaller than that in the related art. As described above, since the sliding area becomes smaller, a friction generated between the outer surface of the first housing and the inner wall surface of the second housing when the first housing is inserted into the fitting space of the second housing becomes smaller than that in the related art. As described above, since the friction becomes smaller, an insertion force of the first housing when the first housing is inserted into the fitting space of the second housing becomes smaller than that in the related art.

According to the above configuration [1], in the state in which the first optical connector and the second optical connector are fitted to each other, the first fitting regulation portion of the fitting regulation convex portion is in contact with the fitting sliding surface. Therefore, play of the first housing in an upper-lower direction is restricted inside the fitting space of the second housing. Since the play of the first housing is restricted in this manner, a center of the ferrule held by the first housing is fixed. As described above, since the center of the ferrule is fixed, a deviation of an optical axis of an optical fiber with respect to an optical axis of the light guide member is suppressed.

Further, according to the above configuration [1], management of dimensions of the fitting regulation convex portion and the fitting regulation concave portion is important, so that a range of dimensions managed in the fitting of the first optical connector and the second optical connector as important dimensions (fitting critical dimensions) decreases as compared with the related art. In this way, reducing the management range of the fitting critical dimensions widens a tolerance range of dimensions except for the fitting critical dimensions.

According to the optical connector device having the above configuration [2], the second fitting regulation portions of the fitting regulation convex portion are in contact with the side wall surfaces of the fitting regulation concave portion in a state in which the first optical connector and the second optical connector are fitted to each other. Therefore, the play of the first housing in a left-right direction is restricted inside the fitting space of the second housing. In addition to restricting the play of the first housing in the upper-lower direction, the play of the first housing in the left-right direction is restricted, so that the center of the fierule held by the first housing is more reliably fixed. Therefore, the deviation of the optical axis of the optical fiber with respect to the optical axis of the light guide member is further suppressed.

According to the optical connector device having the above configuration [3], two fitting regulation convex portions are arranged on an upper side (or a lower side) than the optical axis of the optical fiber and two fitting regulation concave portions corresponding to the two fitting regulation convex portions are arranged, and further, one fitting regulation convex portion is arranged on the lower side (or the upper side) than the optical axis of the optical fiber, and one fitting regulation concave portion corresponding to the one fitting regulation convex portion is arranged. Therefore, the play of the first housing in the upper-lower direction inside the fitting space of the second housing is restricted at three positions. As described above, since the play is restricted at the three positions, the play of the first housing inside the fitting space is suppressed and a rotation of the first housing is restricted with respect to the deviation of the first housing and the deviation of a fitting position when the first housing is inserted into the fitting space of the second housing.

What is claimed is:

1. An optical connector device comprising:
   a first optical connector including a first housing, the first housing being configured to hold a ferrule provided at a distal end of an optical fiber; and
   a second optical connector including a second housing, the second housing being configured to accommodate a fiber optic transceiver and a light guide member for the fiber optic transceiver and including a fitting space into which the first housing is fitted,
   wherein the first housing includes an upper surface, a lower surface, a left side surface, and a right side surface,
   wherein the second housing includes an upper inner wall surface, a lower inner wall surface, a left inner wall surface, a right inner wall surface,
   wherein fitting regulation convex portions extending along a fitting direction of the first optical connector with respect to the second optical connector are provided on one of: the upper surface and the lower surface of the first housing; or the upper inner wall surface and the lower inner wall surface defining the fitting space of the second housing,
   wherein fitting regulation concave portions extending along the fitting direction and to which the fitting regulation convex portions are fitted are provided on another of: the upper surface and the lower surface of the first housing; or the upper inner wall surface and the lower inner wall surface of the second housing,
   wherein each of the fitting regulation convex portions includes a first fitting regulation portion at a distal end portion of the fitting regulation convex portion,
   wherein each of the fitting regulation concave portions includes a fitting sliding surface, on which the first fitting regulation portion is slidable on a deep most part of the fitting regulation concave portion, and gaps are formed between the upper surface, the lower surface, the left side surface, and the right side surface of the first housing, and the upper inner wall surface, the lower inner wall surface, the left inner wall surface, and the right inner wall surface of the second housing,
   wherein each of the fitting regulation convex portions is configured such that the first fitting regulation portion is guided by a corresponding one of the fitting regulation concave portions with the first fitting regulation portion sliding on the fitting sliding surface when the first optical connector and the second optical connector are fitted to each other, and such that the first fitting regulation portion is in contact with the fitting sliding surface in a state in which the first optical connector and the second optical connector are completely fitted to each other,
   wherein the fitting regulation convex portions include at least one first fitting regulation convex portion and at least one second fitting regulation convex portion,
   wherein the at least one first fitting regulation convex portion includes a pair of side surfaces configured as second fitting regulation portions,
   the second fitting regulation portions are configured to be in contact with a pair of side wall surfaces of a corresponding one of the fitting regulation concave portions in the state in which the first optical connector and the second optical connector are completely fitted to each other, and
   wherein the at least one second fitting regulation convex portion include a pair of side surfaces configured to be spaced apart from a pair of side wall surfaces of a corresponding one of the fitting regulation concave portions in the state in which the first optical connector and the second optical connector are completely fitted to each other.

2. The optical connector device according to claim 1, wherein the at least one second fitting regulation convex portion includes a plurality of second fitting regulation convex portions,
   wherein the fitting regulation convex portions provided on the upper surface and the lower surface of the first housing include two second fitting regulation convex portions provided on one of the upper surface and the lower surface and one first fitting regulation convex portion provided on another one of the upper surface and the lower surface, or the fitting regulation convex portions provided on the upper inner wall surface and the lower inner wall surface of the second housing include two second fitting regulation convex portions provided on one of the upper inner wall surface and the lower inner wall surface and one first fitting regulation convex portion provided on another one of the upper inner wall surface and the lower inner wall surface, and
   wherein the fitting regulation concave portions provided on the upper inner wall surface and the lower inner wall surface of the second housing include two fitting regulation concave portions provided on one of the upper inner wall surface and the lower inner wall surface and one fitting regulation concave portion provided on another one of the upper inner wall surface and the lower inner wall surface, or the fitting regulation concave portions provided on the upper surface and the lower surface of the first housing include two fitting regulation concave portions provided on one of the upper surface and the lower surface and one fitting regulation concave portion provided on another one of the upper surface and the lower surface.

\* \* \* \* \*